United States Patent [19]
Davenport

[11] Patent Number: 5,499,003
[45] Date of Patent: Mar. 12, 1996

[54] DIFFERENTIAL SAW FILTER INCLUDING SERIES COUPLED RESONANT/ANTIRESONANT TRACKS

[75] Inventor: Roger A. Davenport, Ft. Lauderdale, Fla.

[73] Assignee: Motorola, Inc., Schaumburg, Ill.

[21] Appl. No.: 317,052

[22] Filed: Oct. 3, 1994

[51] Int. Cl.⁶ .................................................. H03H 9/64
[52] U.S. Cl. .......................................... 333/195; 333/193
[58] Field of Search .................................. 333/193–196; 310/313 R, 313 B, 313 C, 313 D

[56] References Cited

U.S. PATENT DOCUMENTS

| | | | |
|---|---|---|---|
| 3,689,784 | 9/1972 | deKlerk | 310/9.8 |
| 3,825,779 | 7/1974 | deKlerk | 310/9.8 |
| 3,970,970 | 7/1976 | Worley | 333/72 |
| 4,166,258 | 10/1979 | Beng | 333/195 |
| 4,223,284 | 9/1980 | Inoue et al. | 333/150 |
| 5,093,638 | 3/1992 | Kinsman et al. | 333/195 |
| 5,115,216 | 5/1992 | Hikita et al. | 333/195 |
| 5,202,652 | 4/1993 | Tabuchi et al. | 333/193 |
| 5,300,902 | 4/1994 | Satoh et al. | 333/195 |

FOREIGN PATENT DOCUMENTS

| | | |
|---|---|---|
| 0600705 | 6/1994 | European Pat. Off. . |
| 0222511 | 10/1991 | Japan . |
| 4061782 | 3/1994 | Japan . |

Primary Examiner—Benny Lee
Assistant Examiner—Darius Gambino
Attorney, Agent, or Firm—Barbara R. Doutre

[57] ABSTRACT

Resonant and anti-resonant inter digital transducers are coupled on acoustic tracks (302, 304, 306) of a piezoelectric substrate (301) to provide a balanced differential surface acoustic wave (SAW) filter (300).

12 Claims, 7 Drawing Sheets

5,499,003

DIFFERENTIAL SAW FILTER INCLUDING SERIES COUPLED RESONANT/ANTIRESONANT TRACKS

TECHNICAL FIELD

This invention relates in general to surface acoustic wave devices (SAWs) and more specifically to SAW filters.

BACKGROUND

Surface acoustic wave (SAW) devices use waves propagated on the surface of an elastic solid for electronic signal processing. A typical SAW device uses a transducer to convert electromagnetic signal waves, which travel at the speed of light, to acoustic signal waves, which travel at speeds on the order of $10^5$ less than the speed of light. This substantial reduction in wave length allows designers to implement certain complex signaling processing functions in a significantly smaller space than would be needed for traditional circuit designs. Thus, a SAW device designed to handle complex signal processing functions can offer considerable cost and size advantages over competing technologies. SAW technology is increasingly found in applications such as filters, resonators, oscillators, delay lines, and other similar devices.

SAW devices are typically implemented on a piezoelectric substrate and usually employ interdigital transducers (IDTs) located on the surface of the piezoelectric substrate to generate and detect acoustic waves. An example of an interdigital transducer and its' associated equivalent circuit model is shown in FIGS. 1 and 2 of the accompanying drawings. The geometry of the IDTs (beam width, pitch, number of fingers) on the piezoelectric substrate 101 plays a significant role in the signal processing and frequency response characteristics of a SAW device. The interdigital transducer 100 includes electrode bus bars 102, 104 and electrode fingers 106, 108 extending from each electrode bus bar in an interdigitated configuration. The equivalent circuit model 200 is shown between similar nodes 1 and 2 of the interdigital transducer 100. The pitch determines the frequency of operation of a given transducer and is defined as the finger width added to the space between fingers. The beam width and the number of fingers determine the static capacitance, Co, of the transducers. The beam width is defined as the spacing between, but not including, the electrode bus bars. SAW device designers generally achieve the desired operating frequency response of the device by focusing on the geometry of the IDTs, and by the choice of materials used for the piezoelectric substrate.

Conventional SAW filters have transducers located side by side on common tracks and use acoustic coupling to couple between the transducers, however, each acoustic track must be tuned for the same operating frequency. An improvement over the conventional SAW filter is the ladder filter. Conventional SAW ladder filters are differentiated from conventional non-ladder filters in that the transducers in the ladder design are acoustically uncoupled (staggered), use only electrical coupling, and operate at different frequencies (resonant and anti-resonant) at or near a center frequency, $f_o$.

SAW ladder filter designs have demonstrated good performance in the areas of wide fractional bandwidth and low insertion loss. However, both conventional ladder filter designs are typically single ended devices where each transducer impedance element requires a different pitch and acoustic beam width for proper resonator coupling. The tolerances on the individual transducer finger pitches in these conventional single ended ladder filters are required to be very high and are difficult and costly to manufacture. With the increased interest and use of differential circuitry in radio communications devices to achieve the advantages of common mode rejection associated with differential filters, it is crucial that small high performance differential selectivity be available.

Hence, there is a need for a differential SAW filter that provides high performance, particularly with regards to insertion loss and selectivity, and which is also easily manufactured.

DETAILED DESCRIPTION OF THE PREFERRED EMBODIMENT

Figure 1:
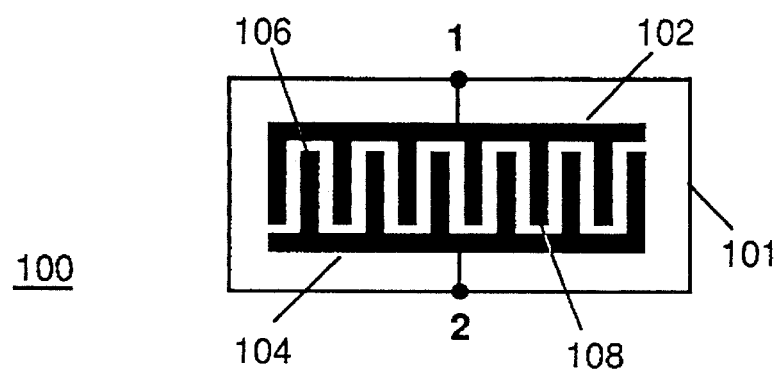
FIG. 1 shows a prior art interdigital transducer.
Figure 2:
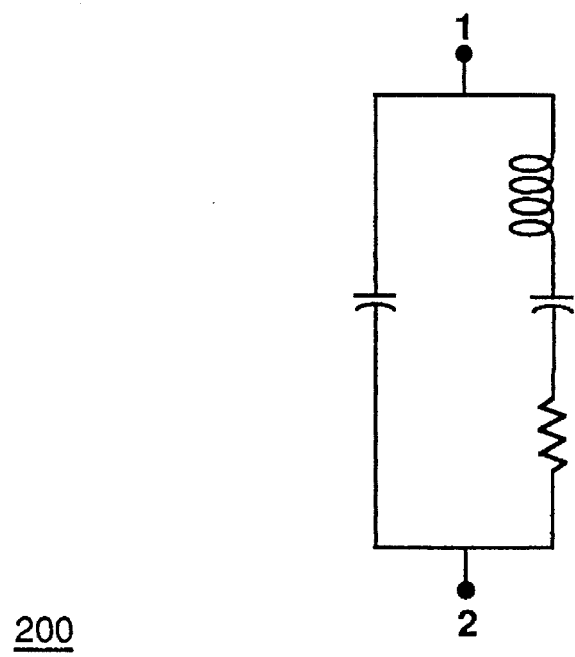
FIG. 2 shows the equivalent circuit model for the interdigital transducer of FIG. 1.
Figure 3:
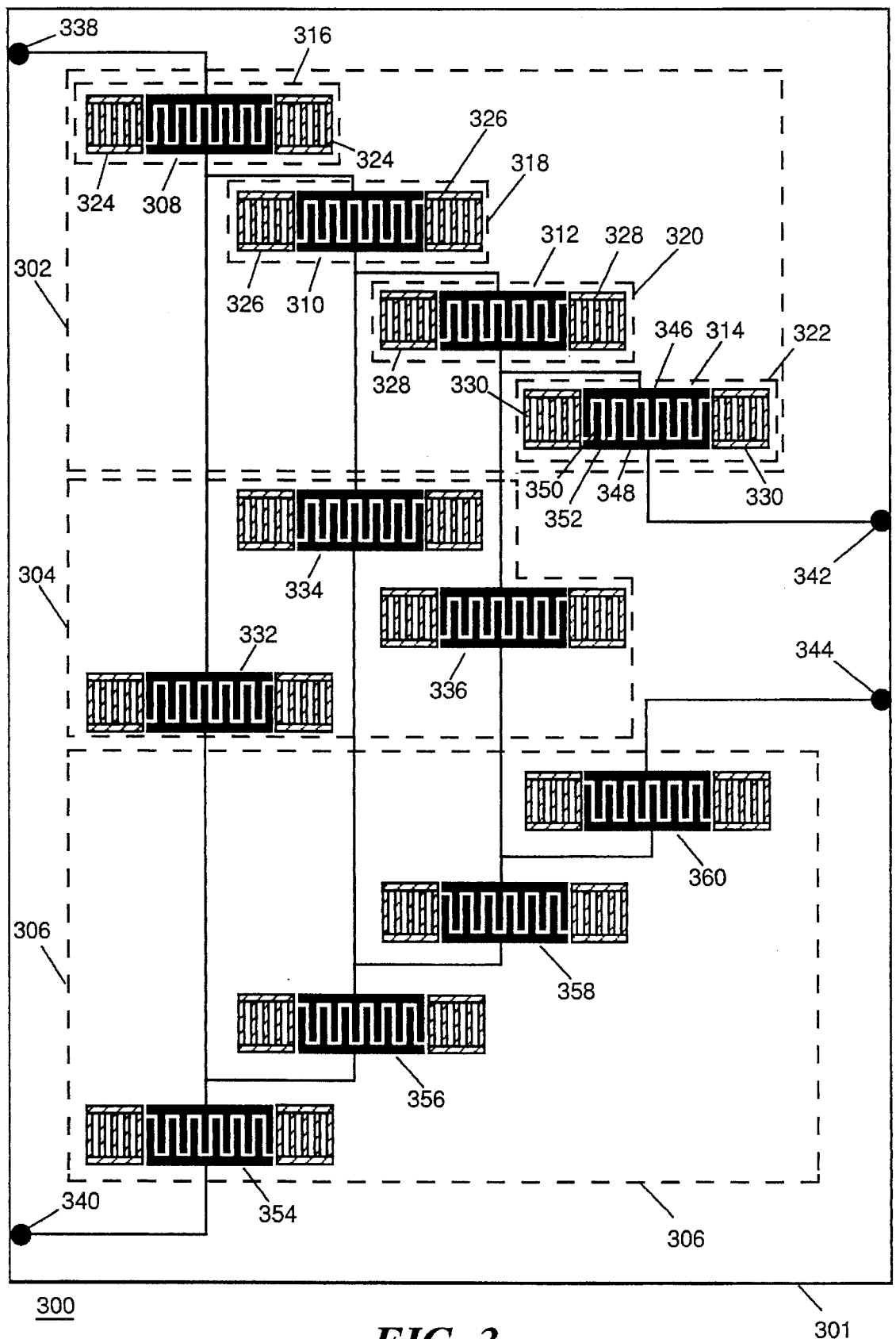
FIG. 3 is a first embodiment of a differential SAW filter in accordance with the present invention.

A first embodiment of a differential SAW filter in accordance with the present invention is shown in FIG. 3 of the accompanying drawings. The filter 300 is a balanced differential SAW filter that operates over a predetermined frequency passband and includes three sets of resonators 302, 306, and 304 located on a piezoelectric substrate 301. The first set of resonators 302 includes four resonators comprising first, second, third, and fourth inter digital transducers 308, 310, 312, 314 electrically connected in series on separate acoustic tracks 316, 318, 320, 322. Each resonator preferably includes a reflector pair 324, 326, 328, 330 (to be described later). The transducers 308, 310, 312, 314 are each tuned for resonance at or near a center frequency $f_o$ within the passband. The second set of resonators 306 include transducers 354, 356, 358, 360 that are substantially geometrically similar (beam width, pitch, number of fingers) to the first set of transducers, and are mirror imaged horizontally onto other acoustic tracks and are similarly tuned for resonant frequency. These series connected transducers operating at resonance at $f_o$ will also be referred to as resonant transducers. The third set (middle) of resonators 304 includes first, second, and third transducers 332, 334, 336 operating at anti-resonant frequency at the center frequency $f_o$ of the passband, each electrically connected in series between the series connection of the first and second sets of resonators 302, 306. Each of these anti-resonant transducers 332, 334, and 336 is therefore electrically coupled in series between each series connection of resonant transducers.

Each interdigital transducer element in the filter 300 includes first and second opposing electrode bus bars, such as electrode bus bars 346, 348, with electrode fingers extending from each bus bar in an interdigital fashion, such as fingers 350, 352. While referring to the transducers in all of the following figures, all transducers will be considered to be interdigital transducers, and electrode bus bars will simply be referred to as electrodes. The first electrode will be considered the top electrode of the transducer and the second electrode will be considered the bottom electrode, for the purpose of describing the interconnections between the transducers. The differential input of the filter 300 is taken from the first electrode of transducer 308 and the second electrode of transducer 354, these electrodes are coupled to input ports 338, 340 of the piezoelectric substrate 301. The differential output of the filter 300 is taken from the second electrode of transducer 314 and the first electrode of transducer 360, these electrodes are taken to output ports 342, 344 of the piezoelectric substrate 301. The series connections between resonant transducers are formed in set 302 by connecting second and first electrodes from adjacent resonant transducers. The series connections between resonant transducers in set 306 are formed by connecting first and second electrodes from adjacent resonant transducers. The anti-resonant transducers 332, 334, 336 are each series connected between resonant transducers in sets 302, 306 by electrically coupling an electrode from a series resonant transducer, such as from transducer 308 and also from transducer 354, to opposing electrodes of an anti-resonant transducer, such as 332, on either side of the anti-resonant transducer.

The balanced differential SAW filter 300 is symmetrical with regards to the geometries used in the formation of the transducers to provide a substantially similar passive impedance at each of the input and output ports. Transducer impedance depends on static capacitance ($C_o$), the substrate parameters, and the number of fingers per transducer. The transducers 308, 310, 312, 314 from the first set 302 are substantially geometrically similar to the second mirror imaged transducers in set 306 (354, 356, 358, 360) when looking across a horizontal axis through the center of the filter. The filter is also impedance symmetric, or electrically symmetric, when looking from left to right and from the right to left in that the geometries of the first and last transducers 308, 314 are substantially similar and the geometries of the second and second to last transducers 310, 312 are substantially similar.

The anti-resonant transducers from set 304 are also symmetric from left to right and right to left. The geometries of the first and last anti-resonant transducers 332, 336 are substantially similar and are tuned for a predetermined impedance with respect to the opposing series resonance transducers on either side. The center anti-resonant transducer 334 has a dissimilar impedance tuned for anti resonance with respect to the opposing resonant impedance on either side.

By mirror imaging like transducers from top to bottom and by using electrical symmetry from left to right, an overall symmetry is created, thus providing a balanced differential SAW filter. By using transducers with similar geometries in a symmetrical pattern, the same input and output impedance can be seen from any input/output port of the differential filter.

While the differential SAW filter 300 has been described with reflectors, the filter can be designed with and without the reflectors. However, the acoustic energy leaving the transducer in a non-reflector design generally creates a loss mechanism in the filter. The purpose of the reflectors is to conserve the energy being lost out the ends of the transducer by reflecting the acoustic energy back into the transducer which increases the resonator's unloaded Q ($Q_u$). The balanced differential SAW filter 300 is designed such that the acoustic paths of the filter are in different propagation paths so the acoustic energy leaving the end of a transducer does not interfere with the response of another transducer. The reflector, however, is not an ideal device, as acoustic energy is lost in the reflector. The energy lost in the reflector is due to the acoustic attenuation of the surface wave as it travels into the reflector and then back out. The acoustic attenuation is the amount of energy lost or converted into unrecoverable bulk energy as the surface wave propagates along the surface of the piezoelectric substrate.

The acoustic attenuation has two components. The first component being gradual conversion of the surface mode to bulk mode as it travels on the uniform surface. The second component being the acoustic scattering that takes place when a surface wave hits a discontinuity, such as the reflector fingers. The entire time the surface wave is in the reflector, no energy is being utilized by the transducer, and consequently, the reflector loss degrades the filter insertion loss.

Figure 4:
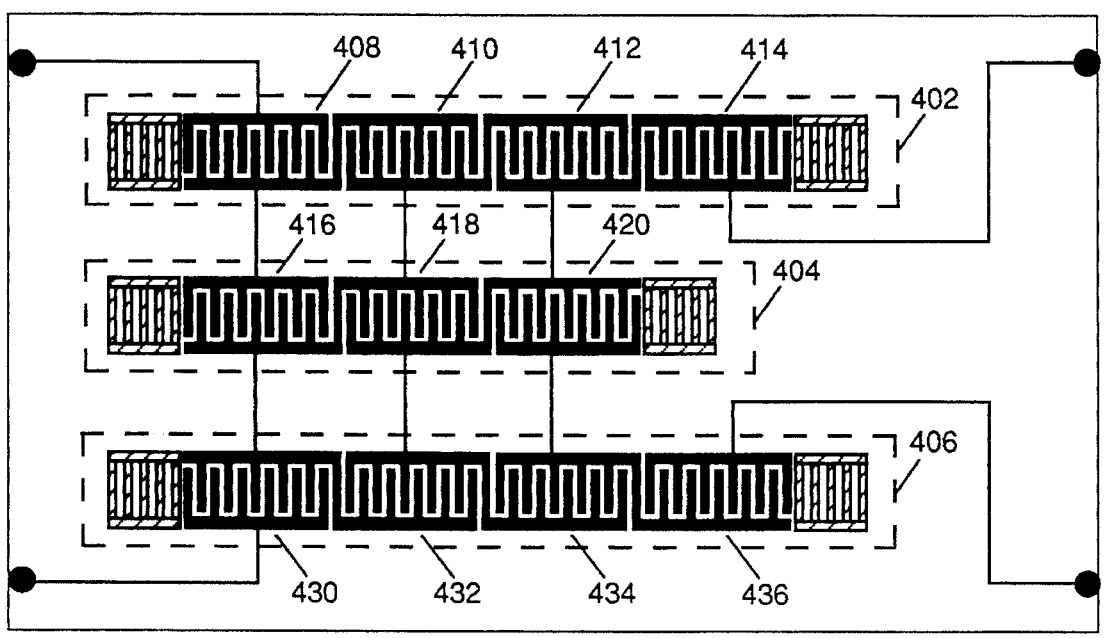
FIG. 4 is a second embodiment of a differential SAW filter in accordance with the present invention.

A second embodiment of the differential SAW filter in accordance with the invention is shown in FIG. 4 of the accompanying drawings. The differential SAW filter 400 is a non ladder formation that provides an ultra low loss SAW filter design by combining acoustic tracks to reduce filter loss, and uses two forms of coupling between adjacent series transducers, and also adjacent parallel transducers.

Interdigital transducers 408, 410, 412, and 414 are electrically and acoustically coupled in series on a common acoustic track 402 and are tuned to operate at resonance at or near a center frequency $f_o$ of the passband. Interdigital transducers 430, 432, 434, and 436 are electrically and acoustically coupled in series in a mirror image configuration on common acoustic track 406 and are substantially similar to the interdigital transducers of track 402. The transducers on acoustic track 406 are similarly tuned to operate at resonance at or near the center frequency $f_o$ of the passband.

Resonant transducers 416, 418, 420 are located on common acoustic track 404 and are each electrically coupled across each series connection of the resonant transducers on opposing tracks 402, 406 forming a anti-resonant transducer between each series connected resonant transducer. The anti-resonant transducers 416, 418, 420 are tuned for anti-resonance at or near $f_o$. Transducers on a given common acoustic track have substantially the same beam width and pitch simplifying the manufacturing process. Within each acoustic track having transducers, the first and last transducers have the same geometries (including the number of electrode fingers), second and second to last transducers have the same geometries, and so on continuing through the track. For an odd number of transducers, such as on track 404, the center anti-resonant transducer 418 has a separate (or dissimilar) geometry with regards to the number of fingers and tunes the electrical coupling between the transducer and the opposing series resonant transducers on either side 410, 412 and 432, 434.

The electrical coupling between the two adjacent transducers 408, 410 is formed by electrically connecting (e.g. through metallized runners, wire bonding, flip chip, or other means) the second (bottom) electrode of transducer 408 to the first (top) electrode of transducer 410, further electrical coupling is controlled by anti-resonant transducer 416 connected to the second (bottom) electrode of resonant transducer 408. Acoustical coupling forms between adjacent transducers 408 and 410, 410 and 412, 412 and 414 on the common acoustic track 402. Similar acoustic coupling is formed between adjacent transducers on acoustic track 406. The anti-resonant transducers on common track 404 also take advantage of acoustic coupling between adjacent transducers. By using the two varieties of coupling, the number of acoustic tracks is reduced which translates into a reduction of reflectors and their associated losses. These multiple coupling techniques allow all transducers on a given acoustic track to have the same beam width and pitch which greatly simplifies the manufacturing process.

By using a mirror imaged configuration of track 402 onto track 406, both tracks are provided with transducers having the same pitch and beam width. While the pitch and beam width of all the series connected transducers on common tracks 402 and 406 are substantially similar, the geometries are also symmetric with regards to the number of fingers for the first and last transducer as well as the second and second to last transducer. Hence, resonant transducers 408, 414, 430, and 436 all have substantially similar geometries and resonant transducers 410, 412, 432, and 434 all have substantially similar geometries. Anti-resonant transducers 416 and 420 have substantially similar geometries and transducer 418 has a separate (dissimilar) geometry than the other transducers, with regard to the number of fingers. The two forms of coupling electrical and acoustical, are aligned for this topology keeping the filter tuned. Differential SAW filter 400 as described by the invention, accommodates differential signals very well since this is a balanced design with electrical symmetry from top to bottom and from left to right.

Transducer impedance depends on static capacitance ($C_o$), the substrate parameters, and the number of fingers. The acoustic coupling between adjacent transducers on a common track depends on the number of fingers in the transducer and the reflection coefficient per finger. The acoustic energy excited near the ends of the transducer is the only acoustic energy which is capable of exiting the transducer to be shared by another transducer. For high coupling coefficient materials the internal reflections are large, causing a high percentage of the total energy to be trapped within the resonant transducer. The acoustic coupling in filter 400 can be adjusted independently of the electrical coupling by trading the beam width for the number of fingers in the transducer, keeping $C_o$ constant. This additional adjustable coupling can be used to limit the impedance level swings in the balanced differential SAW filter 400.

Since the second embodiment has two degrees of freedom (electrical and acoustical) for tuning the coupling between adjacent transducers, the acoustic beam width and pitch can be held uniform on any given acoustic track. This greatly simplifies the manufacturing process which ultimately leads to higher yields and lower cost. This is a distinct advantage over the single ended conventional ladder filters where the tolerances on the individual transducer finger pitches is required to be very high which indicates they are more difficult to manufacture.

Figure 5:
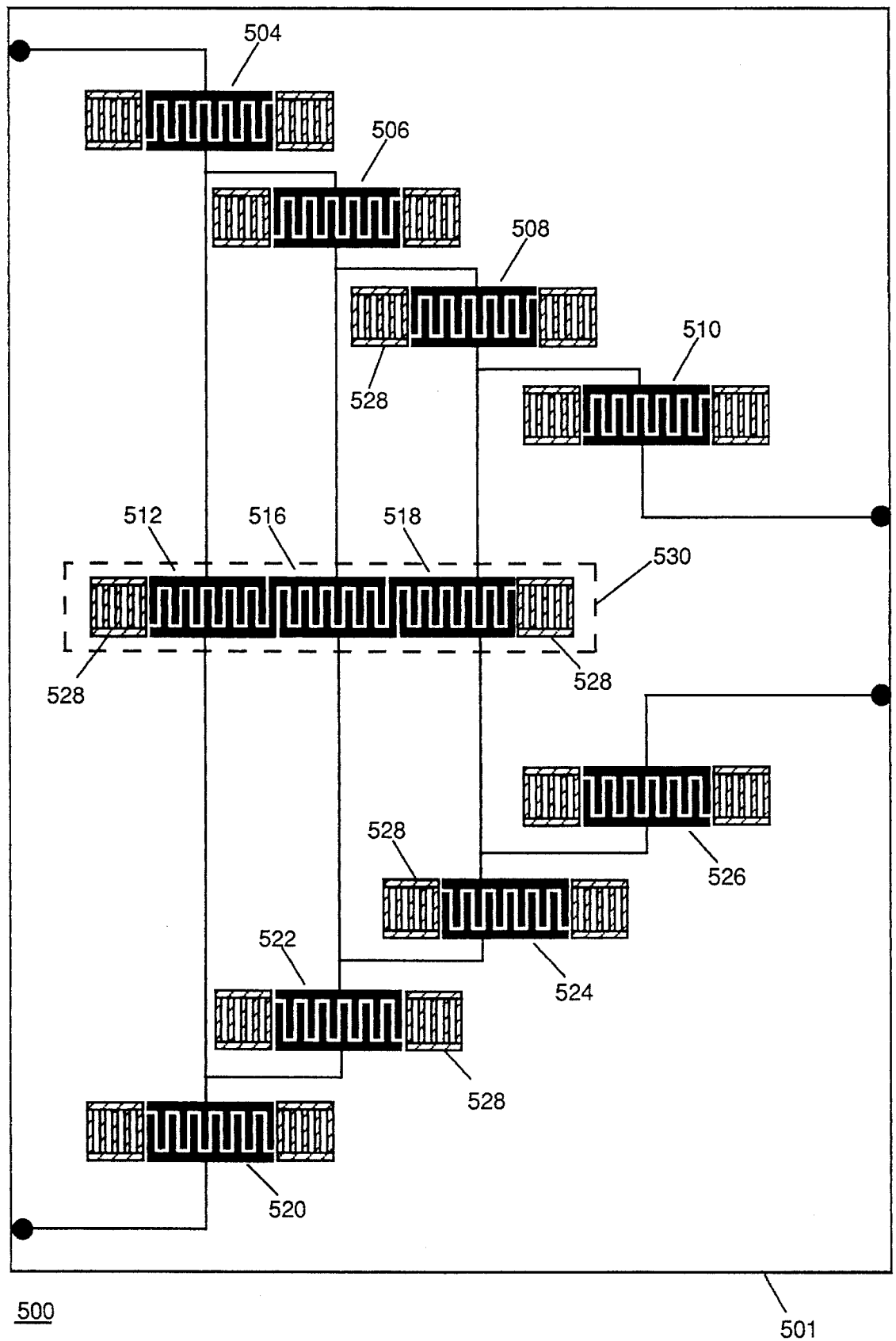
FIG. 5 is a third embodiment of a differential SAW filter in accordance with the present invention.

While the anti-resonant transducers of filter 300 are shown on three acoustic tracks, the reflectors can be removed to allow the anti-resonant transducers to be combined on a single acoustic track, to take advantage the acoustic coupling formed between adjacent transducers. While shown with four series transducers and three anti-resonant transducers, the filter 300 could include more or less resonant and anti-resonant transducers if desired, as long as for every series connection there is one anti-resonant transducer. Reflectors can then be added to the anti-resonant transducers at the ends of the single acoustic track if desired. This embodiment is shown in FIG. 5 of the accompanying drawings. Filter 500 shows staggered series electrically coupled resonant transducers 504, 506, 508, and 510 located on a piezoelectric substrate 501 where again the geometries of the first and last transducers 504, 510 are substantially similar, and also the geometries of second and second to last transducers 506, 508 are substantially similar. The staggered resonant transducers 504, 506, 508, 510 are mirror imaged in a similar fashion to the filter 300 of FIG. 3 using transducers 520, 522, 524, 526. The anti-resonant transducers 512, 518 combined onto single acoustic track 530 are substantially geometrically similar and tuned for anti resonance at or near $f_o$ of the frequency passband, transducer 516 has the same pitch and beam width as 512 and 518 but has a different number of fingers. While shown with reflectors 528 acoustically coupled to each resonant transducer and also at the ends of the anti-resonant transducer track 530, the filter 500 could be designed without the reflectors as well. Again, by using mirror imaged symmetric interdigital transducers to form a balanced differential SAW filter, any input or output port will have a substantially the same passive impedance.

Figure 6:
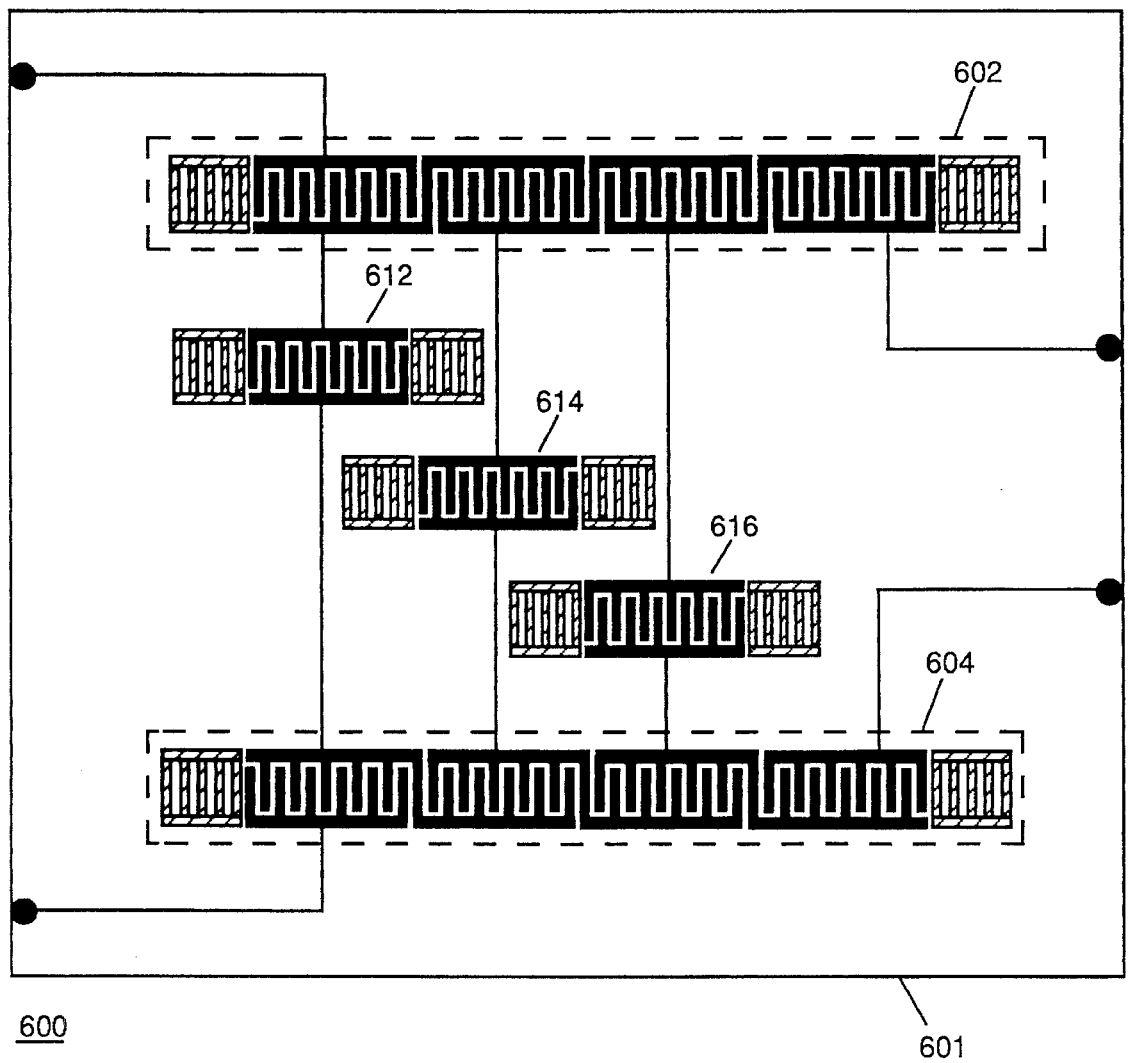
FIG. 6 is a fourth embodiment of a differential SAW filter in accordance with the present invention.

While the anti-resonant transducers of filter 400 are shown on one acoustic track, they can be separated onto separate acoustic tracks similar to the anti-resonant transducers of filter 300. This embodiment is shown in FIG. 6 of the accompanying drawings. In the filter 600, the anti-resonant transducers 612, 614, 616 are staggered and coupled to series connected transducers on tracks 602, 604 of the piezoelectric substrate 601. Anti-resonant transducers 612, 616 have substantially similar geometries, while transducer 614 varies its geometry as far as the number of fingers used to tune the electrical coupling. Filter 600 takes advantage of the electrical and acoustical coupling in its two resonant tracks 602, 604. The series connection between resonant transducers is formed with metallized runners on the substrate 601, however, wire bonds or other means can also be used as well. The similar geometries combined in an electrically symmetric configuration thus provides a balanced filter with a substantially similar impedance from every input and output port.

Figure 7:
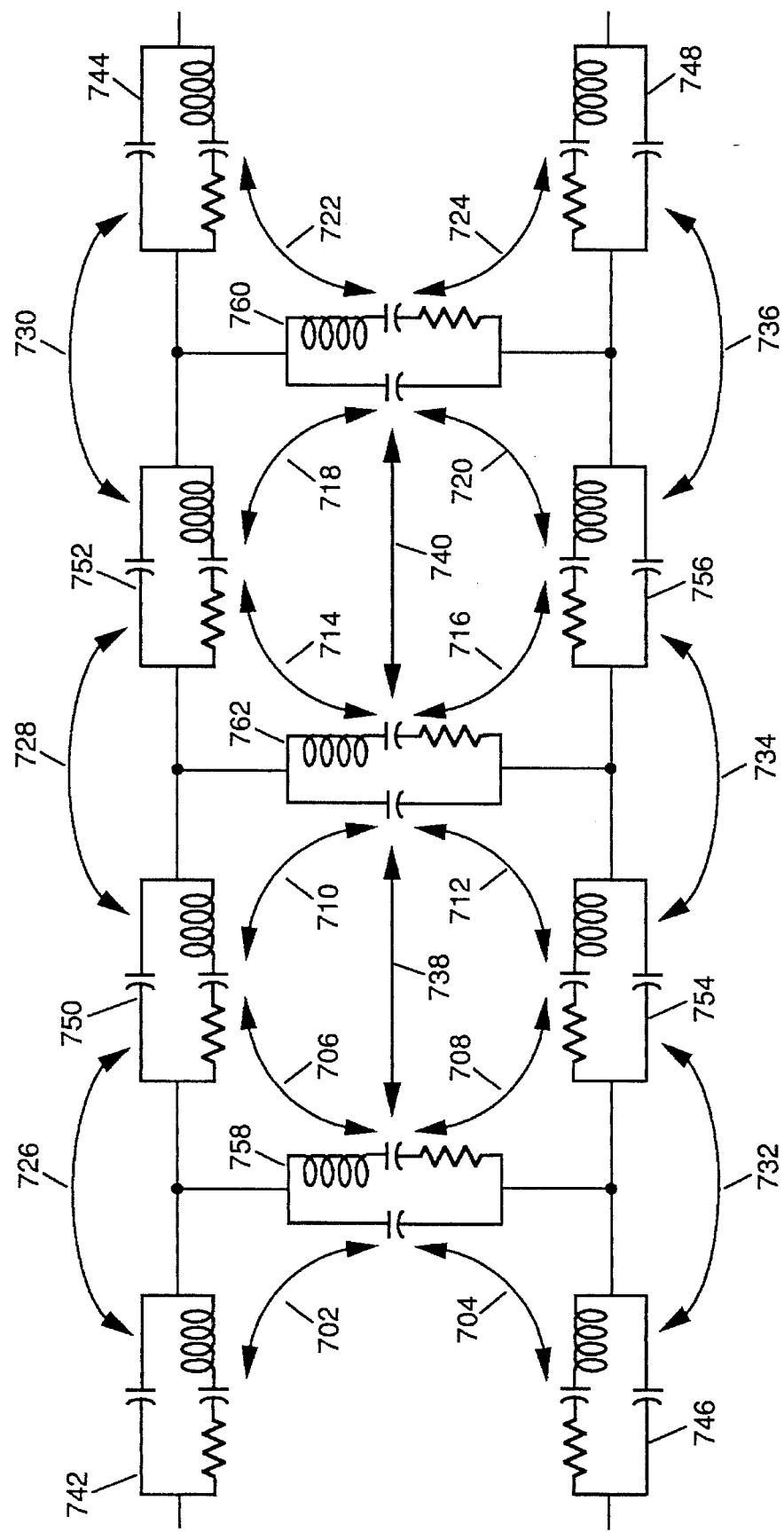
FIG. 7 shows an equivalent circuit model for the differential SAW filter in accordance with the present invention.

All of the filers 300, 400, 500, and 600 provide the same equivalent circuit model shown in FIG. 7 of the accompanying drawings. The electrical coupling is consistent for all four configurations and is represented by electrical coupling designators 702 through 724. The acoustical coupling varies for all four filters starting with filter 300 which has no acoustic coupling, because all of the transducers are staggered. Filter 400 provides acoustic coupling between adjacent transducers on a given track, and is represented by acoustic coupling designators 726 through 740. Filter 500 uses acoustic coupling between adjacent anti-resonant transducers and is represented by acoustic designators 738, 740. Filter 600 uses acoustic coupling between resonant transducers on two acoustic tracks represented by acoustic designators 726 through 736. Similar geometries are used to implement resonant impedance elements 742, 744, 746, and 748. Another set of geometries is used to implement resonant impedance elements 750, 752, 754, and 756. Anti-resonant impedance elements 758 and 760 have similar geometries while a separate (or dissimilar) geometry is used to implement impedance 762. Hence, electric symmetry is provided from top to bottom and right to left providing for a balanced differential SAW filter.

The piezoelectric substrate used in all of the described filters is preferably 41° $LiNbO_3$, however, other piezoelectric substrates can be used as well. The spacing between first, second, third, and fourth resonant transducers is preferably a ¼λ (wavelength) and the spacing between the first second and third anti-resonant transducers is preferably ¾λ, however, other electrical lengths can be used as well.

Figure 8:
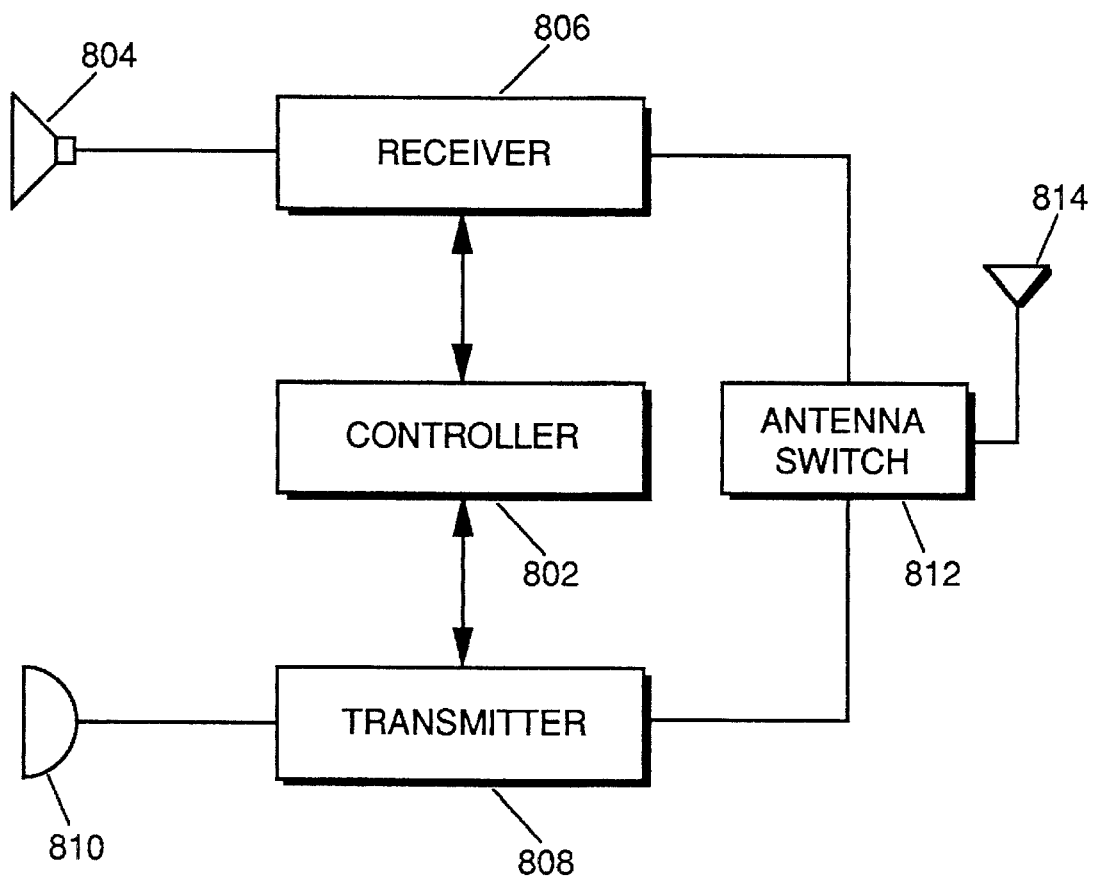
FIG. 8 is a block diagram of a radio in accordance with the present invention.

Referring now to FIG. 8, a block diagram of a communication device, such as a portable two-way radio 800, which uses the balanced differential SAW filter as described by the invention is shown. Radio 800 comprises a receiver 806 and transmitter 808 which are selectively coupled to antenna 814 via antenna switch 812 which can take the form of a conventional antenna switch or a duplexer. Receiver 806 and transmitter 808 are under the control of controller 802 which stores and executes control software.

A speaker 804 is coupled to receiver 806 in order to provide audio to be presented to the radio user. While microphone 810 is coupled to transmitter 808 in order to convert the users voice into electrical signals usable to transmitter 808. The present invention contemplates utilizing the differential SAW filter for the processing of communication signals.

In receiver 806, the received signal is applied to a filter (not shown) which comprises a SAW bandpass filter utilizing a topology such as described by the present invention in order to provide the selectivity for receiver 806. Although described as being used in the receiver, the SAW filter as described by the invention could be used in the transmitter chain as well.

The differential SAW filter as described by the invention combines geometrically similar transducers into symmetrical configurations to provide a balanced differential SAW filter. Since similar geometries are used, the process yields associated with manufacturing these devices goes up and the manufacturing costs go down. By using the differential filter as described by the invention, electronic devices such as two way radios, can take advantage of the common mode rejection associated with differential filters in an easily manufactured device.

What is claimed is:

1. A balanced differential surface acoustic wave (SAW) filter for operation over a frequency passband, comprising:

a piezoelectric substrate having a first, second, and third acoustic tracks;

a first set of transducers electrically connected in series on the first acoustic track and having geometries tuned to operate at resonant frequency in the passband;

a second set of transducers electrically connected in series on the third acoustic track and having identical geometries to the first set of resonators;

a third set of transducers located on the second acoustic track, each electrically coupled in series between each of the series connections of the first and second sets of transducers and tuned for anti-resonant frequency in the passband;

a differential input connected to the first and third acoustic tracks; and a differential output connected to the first and third acoustic tracks.

2. A balanced differential SAW filter as described in claim 1, wherein the first set of transducers includes first, second, third, and fourth resonant transducers, wherein the geometries of the first and fourth resonant transducers are substantially similar and the geometries of the second and third resonant transducers are substantially similar; and the second set of transducers includes first, second, and third anti-resonant transducers wherein the geometries of the first and third anti-resonant transducers are substantially similar.

3. A balanced differential SAW filter as described in claim 2, wherein the spacing between first, second, third and fourth resonant transducers is substantially a ¼λ (wavelength) and the spacing between the first second and third anti-resonant transducers is substantially ¼λ.

4. A balanced differential SAW filter as described in claim 2, wherein the spacing between first, second, third, and fourth resonant transducers is substantially a ¼λ and the spacing between the first second and third anti-resonant transducers is substantially ¾λ.

5. A balanced differential SAW filter as described in claim 1, wherein each of the first, second, and third acoustic tracks each include first and second ends and further comprising reflectors acoustically coupled to the first, second, and third sets of transducers at the first and second ends of the first, second, and third acoustic tracks respectively.

6. A balanced differential SAW filter as described in claim 1, wherein the first set of transducers electrically connected in series are acoustically coupled between series adjacent transducers on the first track and the second set of transducers electrically connected in series are acoustically coupled between series adjacent transducers on the third track.

7. A balanced differential SAW filter as described in claim 6, wherein the third set of transducers operating at anti resonance on the second acoustic track are acoustically coupled between adjacent transducers on said second acoustic track.

8. A balanced differential SAW filter as described in claim 7, wherein the electrical coupling and acoustical coupling are independently adjusted to control the tuning of the balanced differential SAW filter.

9. A communication device, comprising:

a receiver for receiving a communication signal, the receiver including a balanced differential surface acoustic wave (SAW) filter, comprising:

a piezoelectric film having a plurality of acoustic tracks;

a first group of interdigital resonant transducers electrically connected in series on the plurality of acoustic tracks;

a second group of resonant transducers substantially similar to the first group of resonant transducers, mirror imaged onto opposing acoustic tracks;

a third group of interdigital anti-resonant transducers located on at least one acoustic track in between the first and second groups, each anti-resonant transducer electrically connected across opposing series connected resonant transducers and providing a predetermined impedance to the opposing series connected transducers;

the first group of interdigital resonant transducers includes first and last transducers having substantially similar geometries, second and second to last transducers having substantially similar geometries, continuing throughout the first group; and the third group of interdigital anti-resonant transducers includes first and last anti-resonant transducers having substantially similar geometries, and a middle anti-resonant transducer having a dissimilar geometry.

10. A communication device as described in claim 9, further comprising a reflector pair coupled to each resonant and anti-resonant transducer located on multiple acoustic tracks.

11. A communication device as described in claim 9, wherein acoustic coupling forms between the anti-resonant transducers when located on one acoustic track.

12. A balanced differential surface acoustic wave (SAW) filter, comprising:

a piezoelectric film having a plurality of acoustic tracks;

a first group of interdigital resonant transducers electrically connected in series on the plurality of acoustic tracks;

a second group of resonant transducers substantially similar to the first group of resonant transducers, mirror imaged onto opposing acoustic tracks;

a third group of interdigital anti-resonant transducers located on at least one acoustic track in between the first and second groups, each anti-resonant transducer electrically connected across opposing series connected resonant transducers and providing a predetermined impedance to the opposing series connected transducers;

the first group of interdigital resonant transducers includes first and last transducers having substantially similar geometries, second and second to last transducers having substantially similar geometries, continuing throughout the first group; and the third group of interdigital anti-resonant transducers includes first and last anti-resonant transducers having substantially similar geometries, and a middle anti-resonant transducer having a dissimilar geometry.

* * * * *